United States Patent [19]
Schulte et al.

[11] Patent Number: 5,234,104
[45] Date of Patent: * Aug. 10, 1993

[54] CARRIER TAPE SYSTEM

[75] Inventors: Richard D. Schulte, Arlington; Imran Malik, Lewisville; Richard K. Knight, Arlington, all of Tex.

[73] Assignee: Illinois Tool Works Inc., Glenview, Ill.

[*] Notice: The portion of the term of this patent subsequent to May 26, 2009 has been disclaimed.

[21] Appl. No.: 719,367

[22] Filed: Jun. 24, 1991

Related U.S. Application Data

[63] Continuation-in-part of Ser. No. 650,077, Feb. 4, 1991, Pat. No. 5,115,911.

[51] Int. Cl.⁵ ............... B65D 73/02; B65D 85/00
[52] U.S. Cl. .................... 206/330; 206/390; 206/332; 206/341; 206/344; 206/347; 206/486
[58] Field of Search ............ 206/390, 330, 332, 341, 206/344, 347, 477, 486, 490

[56] References Cited

U.S. PATENT DOCUMENTS

| | | | |
|---|---|---|---|
| 3,523,608 | 8/1970 | Miller | 206/330 |
| 4,298,120 | 11/1981 | Kanecko et al. | 206/332 |
| 4,485,531 | 12/1984 | Murphy | 206/344 |
| 4,736,841 | 4/1988 | Kanecko et al. | 206/332 |
| 4,842,135 | 6/1989 | Borst et al. | 206/328 |
| 4,844,258 | 7/1989 | Boeckmann et al. | 206/328 |
| 4,897,074 | 1/1990 | Knight | 493/381 |
| 4,966,281 | 10/1990 | Kawanishi et al. | 206/330 |
| 5,046,610 | 9/1991 | Runyon et al. | 206/330 |
| 5,076,427 | 12/1991 | Thomson | 206/332 |

Primary Examiner—Jimmy G. Foster
Assistant Examiner—M. D. Patterson
Attorney, Agent, or Firm—Schwartz & Weinrieb

[57] ABSTRACT

A carrier tape system includes an elongated base strip and an elongated cover strip both formed of a plastic film material. The cover strip is substantially coextensive in length with the base strip. The cover strip has a top surface and opposed sidewalls extending downwardly from the top surface. The opposed sidewalls are spaced apart from each other a distance substantially equal to the width of the base strip. A cover strip further includes retaining means formed integrally therewith for mechanically engaging and holding down thin component parts seated in cavities formed in the base strip. The retaining means is comprised of a pair of spaced apart rail members which are formed coextensive with the cover strip extending longitudinally to the sidewalls and projecting downwardly and outwardly from the top surface thereof. The rail members are flared outwardly at a slight angle toward the respective opposed sidewalls. The top surface of the cover strip between the spaced apart rail members defines a clear viewing window for viewing the component parts in the cavities.

24 Claims, 3 Drawing Sheets

CARRIER TAPE SYSTEM

CROSS-REFERENCE TO RELATED APPLICATION

This application is a continuation-in-part of co-pending application Ser. No. 650,077 filed Feb. 4, 1991, and entitled "Improved Carrier Tape System" now Pat. No. 5,115,911.

BACKGROUND OF THE INVENTION

This invention relates generally to carrier tapes and more particularly, it relates to an improved carrier tape system for transporting electronic components, pharmaceutical, and the like during production and assembly operations.

As is generally well-known, carrier tapes are commonly used to transport miniature or subminiature components or products from one station to another station in production and assembly operations. Such carrier tapes are typically formed of a base strip of plastic, paper or the like and a cover strip. The base strip is formed with a plurality of cavities or pockets for holding the components and the cover strip is secured to the base strip so as to avoid accidental falling of the components from the cavities. Heretofore, the cover strip was most commonly held in place by an adhesive, heat bond or spaced snap-type fasteners. Typical examples of these type of prior art carrier tapes are disclosed in U.S. Pat. Nos. 3,465,874; 3,650,430; 3,700,019; 3,894,896; 3,910,410; and 4,298,120.

In addition to the above patents, there are various prior art carrier tapes which utilize a continuous mechanical interlock for securing together the base strip and the cover strip. For example, in U.S. Pat. No. 4,733,778 to Hugo Boeckmann et al. issued on Mar. 1, 1988, and entitled "Reusable Carrier Tape," there is disclosed a carrier tape construction in which the base and cover strips are uniformly and consistently secured to each other. At least one of the strips is provided with an integrally formed, longitudinally extending continuous profile which cooperates with the surfaces of the other strip to secure the two strips in a locking arrangement. In addition, in U.S. Pat. No. 4,708,245 to Hugo Boeckmann et al. issued on Nov. 24, 1987, and entitled "Carrier Tape," there is disclosed a carrier tape which includes an elongated base strip, an elongated cover strip, and at least one elongated profile strip bonded to one of the other strips, preferably the base strip. The profile strip is provided with a longitudinally extending continuous, integrally formed profile which cooperates with the surfaces of the cover strip to secure the base and cover strips in a locking engagement.

Further, in U.S. Pat. No. 4,842,135 to Herbert A. Borst issued on Jun. 27, 1989, and entitled "Improved Carrier Tape and Cover Applying and Removal Devices For Same," there is disclosed an improved carrier tape comprising an elongated base strip and an elongated cover strip both formed of a plastic film material. The base strip is provided with longitudinally spaced cavities for components to be transported therein as well as a series of spaced, longitudinally extending sprocket drive holes for advancing the tape through an associated assembly machine. The cover strip has sidewalls extending downwardly and terminating in inwardly directed barbs or profiles. The spacing between the sidewalls is substantially equal to the width of the base strip. A raised, longitudinally extending hump is provided projecting upwardly from the top surface of the cover strip. When the hump is depressed, the sidewalls of the cover strip move laterally outwardly so as to clear the edges of the base strip and thus permit removal of the cover strip. On the other hand, when the hump is released, the sidewalls return to their relaxed positions securely interlocking with the base strip edges.

Furthermore, in U.S. Pat. No. 4,958,053 to Hugo Boeckmann et al. and entitled "Carrier Tape and Method of Manufacturing the Same," there is disclosed a carrier tape having a cover strip and a base strip formed of a plastic material and designed to mechanically interlock with each other. The cover strip includes a top surface from which sidewalls extend downwardly. At least one of the sidewalls includes a segment extending outwardly away from the other sidewall so as to define a camming surface to which a force may conveniently be applied to urge the sidewalls apart, thereby facilitating removal of the cover strip from the base strip. The cover strip may further be provided with a hump of a dovetail configuration.

In U.S. Pat. No. 4,897,074 to Richard K. Knight and entitled "Mechanism For Joining a Carrier Tape Cover to a Base Strip," there is disclosed a carrier tape system which includes an elongated base strip and an elongated cover strip both formed of a plastic film material. The cover strip is substantially coextensive in length with the base strip. The cover strip has a top surface and opposed sidewalls extending downwardly from the top surface. The opposed sidewalls are spaced apart from each other a distance substantially equal to the width of the base strip. The cover strip further includes a hump projecting upwardly from the top surface and extends longitudinally in a parallel relationship to the sidewalls. Each of the sidewalls has an inwardly extending hooked portion formed integrally therewith. The hooked portion has its top surface faced beneath the edge of the base strip to form a U-shaped recess to secure the cover strip to the base strip. All of the aforementioned U.S. Pat. Nos. 4,733,778; 4,708,245; 4,842,135; 4,958,053; and 4,897,074 are assigned to the same assignee as the this invention and are hereby incorporated by reference.

Also, there is taught in U.S. Pat. No. 4,463,851 to Waldo E. Cecil issued on Aug. 7, 1984, and entitled "Protective Enclosure for Electronic Devices," a protective enclosure for electronic devices which includes a tube formed from conductive polyvinyl chloride and having a bottom wall, side walls, and a top wall. The top wall of the tube includes a gap defined by spaced apart edges extending the entire length thereof. A transparent window formed from transparent polyvinyl chloride is mounted on the outer surface of the top wall and extends across the gap to permit observation of electronic devices supported on the central portion of the bottom wall.

Aside from the above U.S. Patents referred to, there is also known in the prior art of British patent application No. 8825154.1 filed on Oct. 27, 1988, and entitled "Tape for Storage of Electronic Components." A corresponding PCT application was filed on Oct. 27, 1989, claiming the priority date of the earlier British patent application and was published on May 3, 1990, under No. WO 90/04915. This PCT application disclosed a tape for storage of electronic flatpacks which includes a series of pockets along its length. Each of the pockets has a floor which is inwardly deformed to define a protrusion extending in a generally rectilinear fashion around the pocket floor. The protrusion is profiled to define a support surface disposed at a first clearance from the floor and a ridge extending along the outer peripheral boundary of the support surface. The top of the ridge is disposed at a second clearance from the floor and by a third clearance from the walls of the pockets. An electronic flatpack having a body and protruding connector pins is carried by the support surface with the pins being disposed over the ridge and extending into the third clearance.

In use, the prior art carrier tapes are usually wound around a storage reel for shipping and handling. While the base strip is provided with cavities which are often contoured to hold the components in place, it has however been encountered heretofore that the components may still be moveable out of the cavities, especially when they are small thin fragile parts, so as to be susceptible to physical and electrostatic discharge (ESD) damage as the carrier tape is wrapped onto the storage reel. As a result, the small thin parts tend to shift or move between the base and cover strips during the winding process, thereby causing them to prematurely fall out of the cavities. All of the various prior art methods of securing the base strip and the cover strip previously discussed (both the adhesion technique and the mechanical interlock type) fail to effectively hold the small thin parts in the cavities of the base strip during the assembly operation.

Accordingly, it would therefore be desirable to provide an improved carrier tape system in which the base strip has trough-like sections interconnected between the cavities and the cover strip has retaining means for movement within the trough-like sections so as to mechanically engage and hold down the components in the cavities during wrapping around a storage reel.

SUMMARY OF THE INVENTION

Accordingly, it is a general object of the present invention to provide an improved carrier tape system having retaining means which is relatively simple and economical to manufacture and assembly, but yet overcomes the disadvantages of the prior art carrier tapes.

It is an object of the present invention to provide a carrier tape system which include a base strip and a cover strip having retaining means for mechanically engaging and holding down components in cavities formed in the base strip.

It is another object of the present invention to provide an improved carrier tape system in which the base strip has trough-like sections interconnected between the cavities and the cover strip has retaining means for movement within the trough-like sections so as to mechanically engage and hold down the components in the cavities.

It is still another object of the present invention to provide an improved carrier tape system in which the cover strip has a ridge for mechanically engaging and pressing against the top surfaces of components in cavities formed in the base strip.

It is yet still another object of the present invention to provide an improved carrier tape system in which the cover strip includes a pair of spaced-apart rail members for mechanically engaging and fitting tightly against the top surfaces of components in cavities formed in the base strip.

In accordance with these aims and objectives, the present invention is concerned with the provision of improved carrier tape system which includes an elongated base strip and an elongated cover strip which is substantially coextensive in length with the base strip. The cover strip has a top surface and opposed sidewalls extending downwardly from the top surface. The opposed sidewalls are spaced apart from each other a distance substantially equal to the width of the base strip. The cover strip further includes retaining means formed integrally therewith for mechanically engaging and holding down components in cavities formed in the base strip.

In another aspect of the invention, the retaining means is comprised of a pair of spaced-apart rail members coextensive with the cover strip and projecting downwardly and outwardly at a slight angle from being perpendicular to the top surface thereof. Further, in still another aspect of the invention, the base strip is formed with a plurality of specially-designed cavities having a plurality of ridge segments disposed therein for retaining the body of a fine pitch surface mount device.

In still yet another aspect of the invention, the cover strip having the spaced-apart rail members includes a clear viewing window strip of an anti-static or static dissipative material formed in its top surface and between the rail members with the remainder of the cover strip being made of a conductive plastic material. In yet still another aspect of the invention, such cover strip may be used with the base strip having the specially-designed cavities to store sensitive electronic devices to provide a carrier tape system which offers improved protection against damage from ESD by quickly conducting static charges away from the electronic devices.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
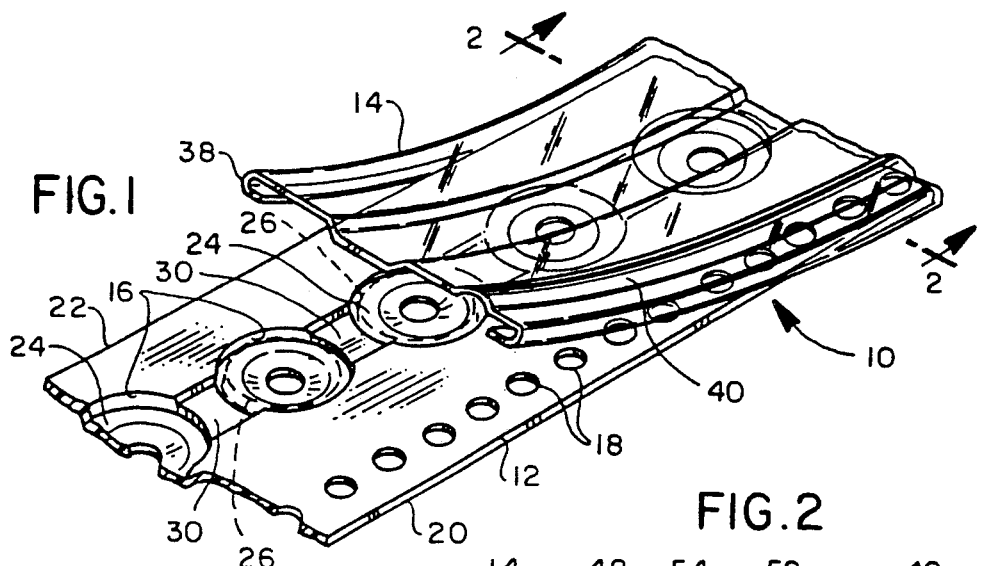
FIG. 1 is a fragmentary, perspective view of a carrier tape system, constructed in accordance with the principles of the present invention.

Referring now in detail to the drawings, there is shown in FIGS. 1 through 4 an improved carrier tape system 10 which is constructed in accordance with the principles of the present invention. The carrier tape system 10 is comprised of an elongated base strip 12 and a generally coextensive cover strip 14. The carrier tape system 10 is preferably formed of a suitable plastic film material such as carbon loaded polyvinyl chloride, polypropylene or a glycol-based polyester such as polyethylene terephthalate (PETG) which may be readily extruded and vacuum or pressure formed to the desired shape. The carrier tape resin may be formulated with appropriate additives to render the base and cover strips anti-static or static dissipative as may be required. The improved carrier system 10 should be sufficiently flexible to permit it to be spooled or wound on a storage reel.

The base strip 12 is formed with a plurality of cavities 16 which define individual pockets for the components to be conveyed therein. In this regard, the cavities 16 may be contoured, as required, to maintain the component in a particular orientation, should such orientation be necessary. A series of aligned sprocket holes 18 is provided extending through the base strip 12, adjacent to and outward of the cavities 16. The base strip 12 further includes a first edge 20 disposed outwardly of the sprocket holes 18 and a second edge 22 disposed outwardly of the cavities 16.

Further, it will be noted that each of the cavities 16 is of a generally circular shape and is formed with round support ledges 24 disposed about the interior circumference of the cavities. When the components 26 to be conveyed in the cavities are small, thin fragile parts, such as metallic disc-shaped dome switch pads, only the periphery of the lower surface of the pad is to be held by the support ledges 24 within the cavity so that the entire lower surface does not contact the bottom surface 28 of the cavity, thereby reducing the possibility of physical damage.

The base strip 12 also includes a plurality of recesses or trough-like sections 30, each extending longitudinally between and interconnecting two adjacent cavities 16. The trough-like sections 30 serve to receive retaining means formed on the cover strip 14 for movement therein, as will be presented hereinafter. Each of the trough-likesection 30 is defined by vertical walls 32, 34 which are spaced apart from each other by a distance equal to less than the diameter of the cavities 16.

The cover strip 14 is coextensive in length with the base strip 12. The cover strip 14 is provided at each side, with downwardly extending sidewalls 36 and 38. These sidewalls 36, 38 are spaced apart from each other a distance equal substantially to the width of the base strip 12. A cover strip 14 also includes a longitudinally extending upwardly projecting hump 40 along its entire length. The hump 40 is used to provide a "living hinge" for major portion 42 and minor portion 44 of the top face of the cover strip 14 defined on opposite sides of the hump.

The sidewall 36 has formed integrally therewith an inwardly extending hooked portion 46. The undersurface of the cover strip 14 adjacent the sidewall 36 and the top surface of the hooked portion 46 form a continuous longitudinally extending U-shaped recess or slot 48.

Similarly, the sidewall 38 has formed integrally therewith an inwardly extending hooked portion 50. The undersurface of the cover strip 14 adjacent the sidewall 38 and the top surface of the hooked portion 50 form a continuous longitudinally extending U-shaped recess or slot 52.

The cover strip 14 also includes a longitudinally extending retaining means formed of a downwardly extending U-shaped depression or ridge 54 disposed substantially in the intermediate area of the major portion 42. The ridge 54 is defined by spaced apart vertical wall members 56, 58 joined together by a horizontally flat crossmember 60. When the base strip 12 with its cavities 16 thereof loaded with small thin parts 26 and the cover strip 14 are joined together in the assembled condition, the ridge 54 in the cover strip 14 will travel or move in the corresponding trough-like sections 30 in the base strip 12 so as to cause the lower surface of the flat crossmember 60 to mechanically engage and press against the top surfaces of the thin parts 60 seated in the cavities 16, as can best be seen from FIG. 2. As a consequence, the crossmember 60 of the ridge 54 serves to efficiently and effectively hold down the thin parts in the cavities and thus restricts any extraneous movement thereof. Therefore, the thin parts 26 are in this manner prevented from prematurely falling out of the cavities 16 during wrapping of the carrier tape system 10 around a storage reel for subsequent shipment and/or use.

Figure 2:
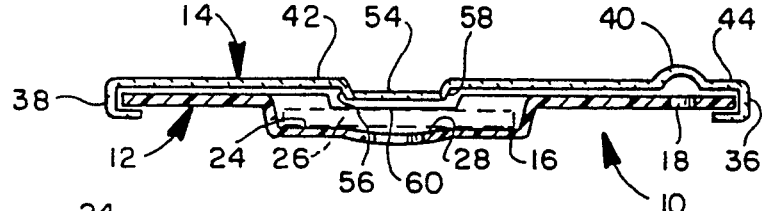
FIG. 2 is a cross-sectional view of the carrier tape system of FIG. 1, taken along the lines 2—2.
Figure 3:
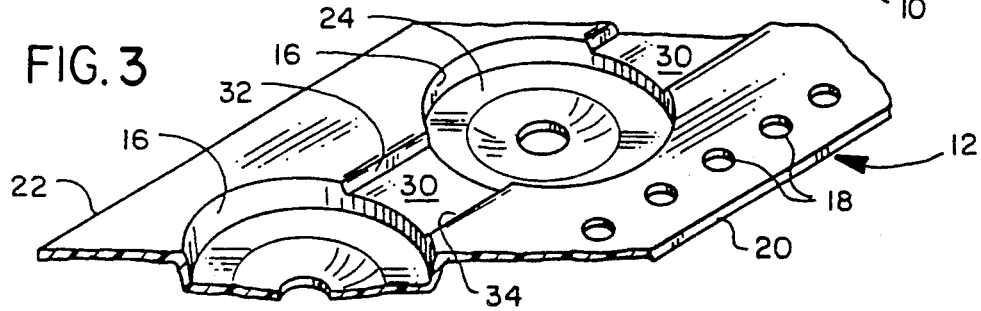
FIG. 3 is a side elevational view of the base strip of the carrier tape system of FIG. 1.

The sizes of the U-shaped recesses 48 and 52 are such that when the cover strip 14 is mechanically interengaged with the base strip 14, the edges 20, 22 of the base strip are received within the recesses 48 and 50, as best seen from FIG. 2. Further, in the assembled condition the hump 40 is positioned to be aligned over the line of sprocket holes 18 thereby providing clearance for engaging the protruding teeth of a sprocket drive wheel of an assembly mechanism with which the carrier tape system 10 is to be used.

Figure 4:
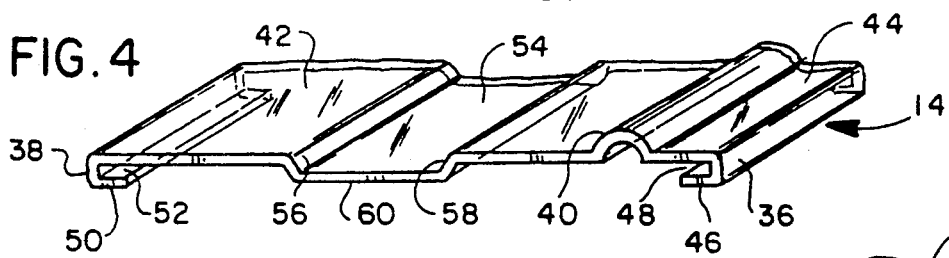
FIG. 4 is a side elevational view of the cover strip of the carrier tape system of FIG. 1.
Figure 5:
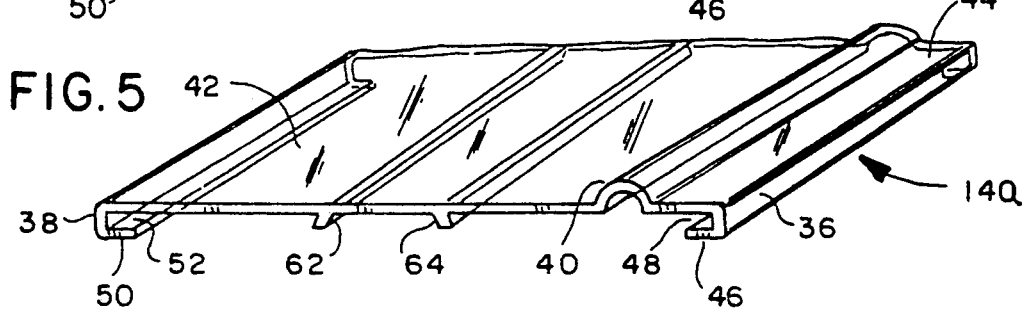
FIG. 5 is a side elevational view of a second embodiment of a cover strip of the present invention.

In FIG. 5, there is illustrated a second embodiment of a cover strip 14a in which retaining means is comprised of a pair of spaced apart projections or rail members 62, 64. The rail members 62, 64 extend downwardly from the lower surface of the major portion 42 in substantially its intermediate area. The rail members are spaced apart a distance which is approximately equal to the width of the crossmember 60 of FIG. 4. The rail members function in a similar manner for mechanically engaging and fitting tightly against the top surfaces of the thin parts seated in the cavities, thereby precluding disengagement of the parts from the cavities during the assembly operation.

Figure 6:
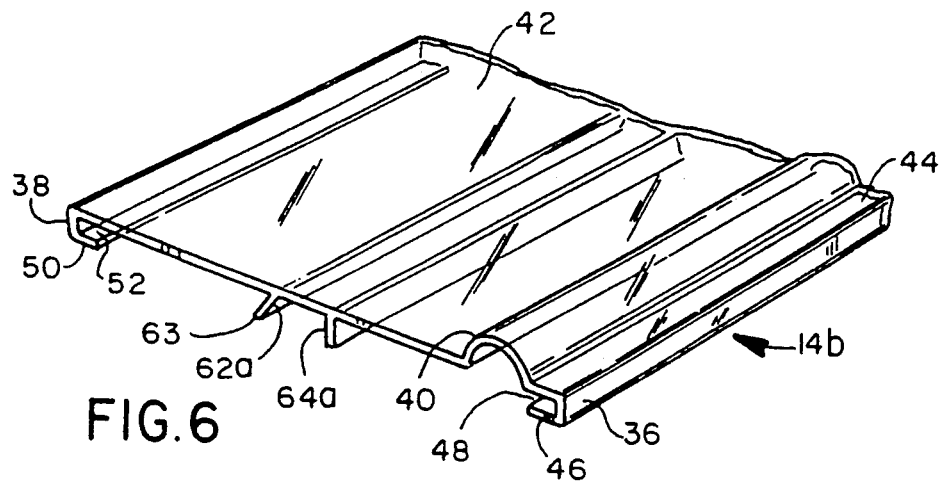
FIG. 6 is a fragmentary, perspective view of a third embodiment of a cover strip of the present invention.

In FIG. 6, there is illustrated a third embodiment of a cover strip 14b in which retaining means is comprised of a pair of spaced-apart projections or rail members 62a, 64a. The rail members 62a, 64a extend downwardly and outwardly from the lower surface of the major portion 42 in substantially its intermediate area. It will be noted that each of the rail members 62a, 64a is not disposed perpendicularly to the lower surface of the major portion 42 as in the embodiment of FIG. 5, but is arranged to be at a slight angle from being perpendicular to the lower surface thereof. In other words, the rail members 62a, 64a are angled or flared outwardly an additional 10° approximately toward the respective sidewalls 38, 36. This feature ensures that the lower ends 63 of the rail members 62a, 64a are prevented from engaging the top surface of the trough-like sections 30 and thus do not impede movement of the cover strip relative to the base strip during assembly.

The rail members 62a, 64a are likewise spaced apart a distance which is approximately equal to the width of the crossmember 60 of FIG. 4. The rail members 62a, 64a also function in the same manner as the rail members of FIG. 5 for mechanically engaging and fitting tightly against the top surfaces of the component parts seated in the cavities, thereby precluding disengagement of the component parts from the cavities during the assembly operation.

Figure 7:
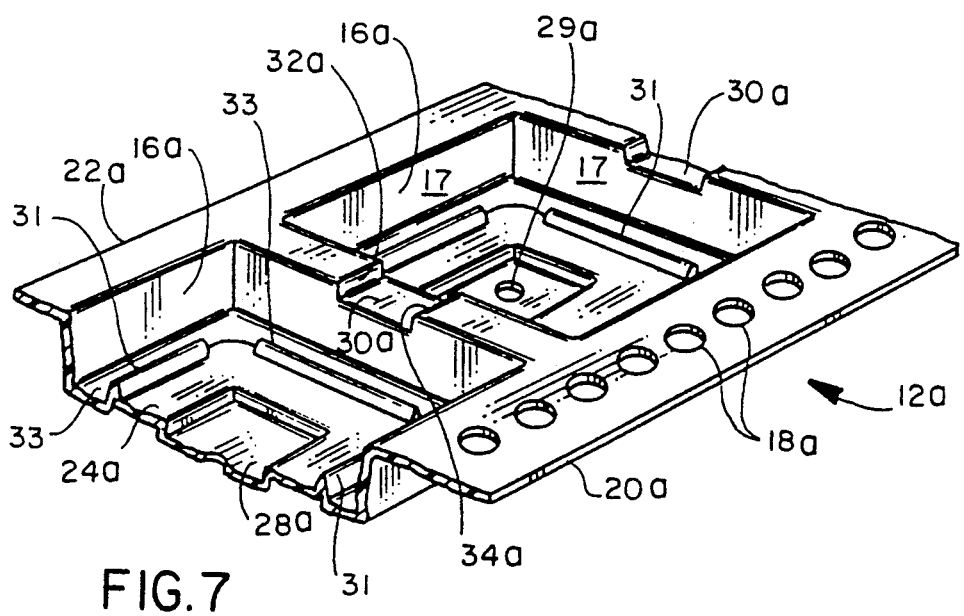
FIG. 7 is a fragmentary, perspective view of a second embodiment of a base strip of the present invention.

Referring now to FIG. 7, there is depicted a second embodiment of a base strip 12a which is formed with a plurality of cavities 16a defining individual pockets for holding component parts to be conveyed therein. A series of aligned sprocket holes 18a is provided extending through the base strip 12a, adjacent to and outward of the cavity 16a. The base strip 12a further includes a first edge 20a disposed outwardly of the sprocket holes 18a and a second edge 22a disposed outwardly of the cavity 16a.

As can be seen, each of the cavities 16a has a generally rectangular or square shaped configuration and is defined by four sidewalls 17. Each of the cavities 16a includes a rectangularly-shaped support ledge surface 24a having a rectangularly-shaped recessed bottom surface 28a located in its central portion thereof. The bottom surface 28a is provided with a circular opening 29a which allows for manual removal of the component parts and for permitting sensing by electronic means of whether there is a part in each of the cavities.

Adjacent each of the four outer edges of the support ledge surface 24a, there is disposed an inverted V-shaped connecting ridge segment 31 which is used to join integrally each side edge of the support ledge surface 24a to one side of a peripheral bottom surface 33 of the cavity. It will be noted that the peripheral bottom surfaces 33 lie in the same plane as the recessed bottom surface 28a. The other side of each of the peripheral bottom surfaces 33 is formed integrally with one of the respective four sidewalls 17. With this specially-designed contour, the cavities 16a have been fabricated to locate and hold a fine pitch surface mount device 26a, such as a semiconductor I.C. device commonly referred to as a quad flat pack (QFP) device having fine pitch leads 27 extending outwardly from the four sides of its rectangularly-shaped body 29, so that the fine pitch leads does not contact or touch any portion of the carrier tape system, thereby eliminating the possibility of physical damage.

The base strip 12a also includes a plurality of recesses or trough-like sections 30a, each extending longitudinally between and interconnecting two adjacent cavities 16a. The trough-like sections 30a serves to receive the retaining means 62a, 64a formed on the cover strip 14a of FIG. 6 for movement therein. Each of the trough-like sections 30a is defined by vertical walls 32a, 34a which are spaced apart from each other by a distance equal to less than the width of the cavity 16a.

Figure 8:
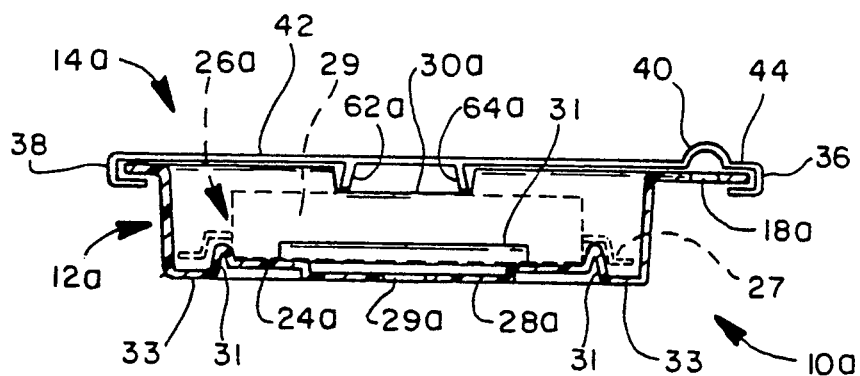
FIG. 8 is a cross-sectional view, similar to FIG. 2, illustrating another embodiment of a carrier tape system of the present invention consisting of the cover strip of FIG. 6 and the base strip of FIG. 7 for conveying a quad flat pack device disposed in the cavity.

There is shown in FIG. 8 of the drawings another embodiment of an improved carrier tape system 10a which is comprised of the elongated base strip 12a of FIG. 7 and the generally coextensive cover strip 14a of FIG. 6. It can be seen that the base strip 12a has its cavities 16a thereof loaded with the QFP device 26a (which is shown in phantom) and that the cover strip 14a is secured to the base strip 12a in the assembled condition. It should be noted that only the periphery of the lower surface of the body 29 of QFP device 26a is held by the support ledge surface 24a within the cavity so that the remaining lower surface or central portion of the body 29 does not contact the recessed bottom surface 28a of the cavity, thereby reducing the chance of physical damage. Further, the fine pitch leads 27 extend horizontally and outwardly over the corresponding plurality of ridge segments 31 and the ends thereof are suspended freely above the respective peripheral bottom surfaces 33. As a result, the leads 27 do not engage or contact any portion of the base strip 12a so as to likewise avoid physical damage thereto.

During assembly, the angularly disposed pair of rail members 62a, 64a will travel or move freely in the corresponding trough-like sections 30a in the base strip 12a so as to cause the lower ends 63 thereof to mechanically engage and press against the top surface of the body 29 of the QFP device 26a seated in the cavity 16a, as can best be seen from FIG. 8. As a consequence, the plurality of ridge segments 31 serves to efficiently and effectively retain or fence in the body 29 of the device 26a in the cavity 16a and thus restricts any extraneous movement thereof. Therefore, the QFP devices 26a are in this fashion prevented from prematurely falling out of the cavity 16a during wrapping of the carrier tape systems 10a around a storage reel for subsequent shipment and/or use.

Figure 9:
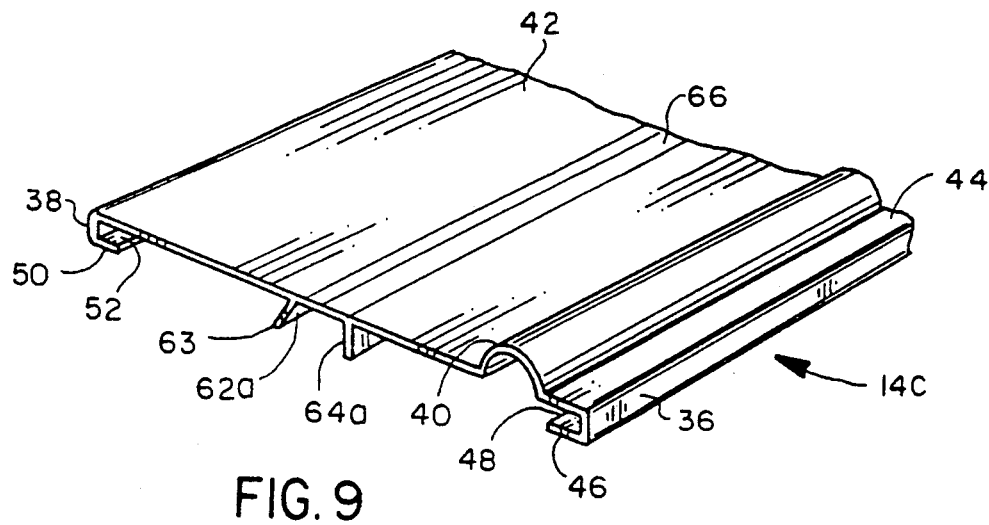
FIG. 9 is a fragmentary, perspective view of a fourth embodiment of a cover strip of the present invention.

In FIG. 9, there is illustrated a fourth embodiment of a cover strip 14c which is quite similar to the embodiment of FIG. 6. The cover strip 14c includes the retaining means comprised of a pair of spaced-apart, stand-off ribs or rail members 62a, 64a. The stand-off ribs 62a, 64a extend downwardly and outwardly from the lower surface of the major portion 42 in substantially its intermediate area. A transparent or clear viewing window strip 66 is integrally formed in the major portion 42 of the cover strip 14c between the stand-off ribs 62a, 64a.

The entire cover strip 14b in the embodiment of FIG. 6 is preferably formed of an anti-static or static dissipative material. The cover strip 14c in FIG. 9 is different from FIG. 6 in that only the relatively narrow window strip 66 is made of the anti-static or static dissipative material and the remainder of the cover strip 14c is preferably made of a conductive plastic material, such as carbon loaded polyvinyl chloride. The cover strip 14c fabricated in this manner provides improved protection against damage from ESD by quickly conducting any static charges away from sensitive electronic devices contained within the cavities of the base strip. Further, such cover strip 14c facilitates viewing the interior of the cavities of the base strip so as to permit a customer or user to visually verify whether the cavities are filled with the electronic devices.

It should be apparent to those skilled in the art that as an alternative to the embodiment of FIG. 6 the area in the major portion 42 of the cover strip 14b between the spaced-apart rail members 62a, 64a could be formed with an opening or a plurality of openings so as to facilitate viewing of the interior of the cavities in the base strip. However, this cover strip design would only be acceptable to customers who do not require the improved ESD protection offered by the embodiment of FIG. 9.

Figure 10:
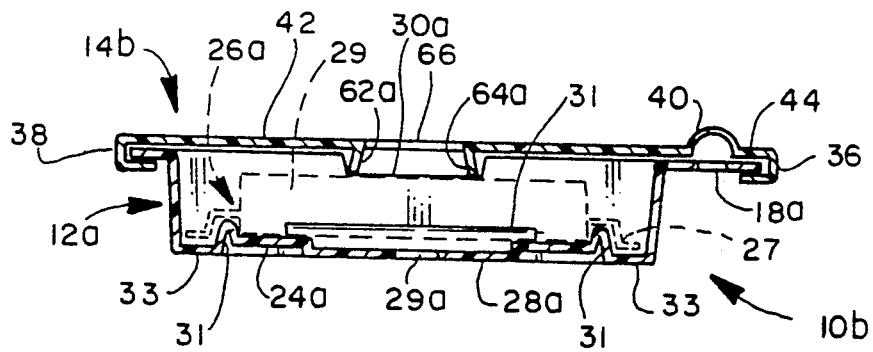
FIG. 10 is a cross-sectional view, similar to FIG. 8, illustrating still another embodiment of a carrier tape system of the present invention consisting of the cover strip of FIG. 9 and the base strip of FIG. 7.

There is depicted in FIG. 10 still another embodiment of an improved carrier tape system 10b which is comprised of the elongated base strip 12a of FIG. 7 and the generally coextensive cover strip 14b of FIG. 9. It can be seen that the base strip 12a has its cavities 16a loaded with the QFP devices 26a (which is shown in phantom) and that the cover strip 14b is secured to the base strip 12a in the assembled condition. This carrier tape system design offers improved ESD protection since the cover strip 14b having the stand-off ribs 62a, 64a is fabricated entirely of the conductive plastic material, except for the clear viewing window 66 located between the ribs. As will be noted, the ribs 62a, 64a serve to engage against the top surfaces of the QFP devices 26a and to hold the same away from the viewing window 66. As a result, any electrostatic charge may be quickly conducted away so as to protect the QFP devices 26a contained within the cavities 16a of the base strip 12a. Except for these differences, the carrier tape system 10b of FIG. 10 is identical in structure and function to the tape system 10a of FIG. 8.

From the foregoing detailed description, it can thus be seen that the present invention provides an improved carrier tape system in which the base strip has trough-like sections interconnected between the cavities and the cover strip has retaining means for movement within the trough-like section. The retaining means serves to mechanically engage and hold down the components in the cavities, thereby preventing them from prematurely falling out of the cavities during wrapping of the carrier tape system around a storage reel. The retaining means is formed suitably of either a ridge or a pair of spaced apart rail members.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A carrier tape system, comprising:
   an elongated base strip;
   an elongated cover strip coextensive in length with said base strip;
   said cover strip having a top surface and opposed sidewalls extending downwardly from said top surface, said opposed sidewalls being spaced apart from each other a distance substantially equal to the width of said base strip, and means for securing said cover strip to said base strip;
   said base strip having an upper surface for engaging said cover strip when said cover strip is secured to said base strip; a plurality of longitudinally spaced cavities, extending downwardly from said upper surface of said base strip, for housing a plurality of components therein; and a plurality of trough-like grooves extending longitudinally between and interconnecting adjacent ones of said plurality of cavities at a level beneath said upper surface of said base strip but above a bottom wall portion of each one of said cavities upon which each one of said components is supported; and
   retaining means extending downwardly from a lower surface of said cover strip so as to be disposed within said longitudinally extending trough-like grooves of said base strip when said cover strip is secured to said base strip and for engaging said components disposed within said cavities of said base strip so as to retain said components within said cavities of said base strip;
   said plurality of component cavities include a plurality of ridge segments disposed therein for engaging peripheral portions of said components disposed within said cavities for confining said components at predetermined lateral positions within said cavities.

2. A system as set forth in claim 1, wherein:
   said retaining means comprises a pair of laterally spaced rail members coextensive with said cover strip and extending longitudinally parallel to said sidewalls.

3. A carrier tape system as claimed in claim 2, wherein said rail members of said retaining means are flared outwardly at a slight angle toward said respective opposed sidewalls.

4. A carrier tape system as claimed in claim 1, wherein said cover strip includes a hump projecting upwardly from said top surface and extending longitudinally in a parallel relationship to said sidewalls.

5. A carrier tape system as claimed in claim 4, wherein said base strip further includes a plurality of longitudinally spaced sprocket hole extending therein adjacent said cavities.

6. A carrier tape system as claimed in claim 5, wherein said sprocket holes are aligned with said hump of said cover strip.

7. A carrier tape system as claimed in claim 6, wherein each of said sidewalls has an inwardly extending hooked portion formed integrally therewith, said hooked portion having its top surface spaced beneath the edge of said base strip to form a U-shaped recess to secure said cover strip to said base strip.

8. A carrier tape system as claimed in claim 1, in said plurality of component cavities are of a rectangularly-shaped configuration and includes said plurality of ridge segments disposed therein for retaining the body of a fine pitch surface mount device having fine pitch leads so that the leads are free of engagement with any portion of the carrier tape system.

9. A system as set forth in claim 1, wherein:
   said cover strip is fabricated from a resilient plastic material.

10. A system as set forth in claim 1, wherein:
    each one of said plurality of cavities has said bottom wall portion comprising an elevated peripheral portion and an elevationally depressed central portion whereby when said components are disposed within said cavities, each one of said components will be supported by means of a peripheral portion thereof upon said elevated peripheral portion of said bottom wall portion while a central portion of each one of said components will be free of contact with said bottom wall portion so as to reduce the possibility of physical damage to each one of said components by said bottom wall portion.

11. A system as set forth in claim 1, wherein:
    each one of said plurality of cavities has said bottom wall portion having an aperture defined therein for permitting sensing means to determine the presence or absence of a component within each one of said cavities.

12. A carrier tape system as claimed in claim 1, wherein the top surface of said cover strip between said spaced apart rail members defines a clear viewing window for viewing the components in the cavities.

13. A carrier tape system as claimed in claim 12, wherein said viewing window is formed of an anti-static material and the remainder of said cover strip is made of a conductive plastic material.

14. A carrier tape system, comprising:
an elongated base strip;
an elongated cover strip coextensive in length with said base strip;
said cover strip having a top surface and opposed sidewalls extending downwardly from said top surface, said opposed sidewalls being spaced apart from each other a distance substantially equal to the width of said base strip, and means for securing said cover strip to said base strip;
said base strip having an upper surface for engaging said cover strip when said cover strip is secured to said base strip; a plurality of longitudinally spaced cavities, extending downwardly from said upper surface of said base strip, for housing a plurality of components therein; and a plurality of trough-like grooves extending longitudinally between and interconnecting adjacent ones of said plurality of cavities at a level beneath said upper surface of said base strip but above a bottom wall portion of each one of said cavities upon which each one of said components is supported; and
retaining means extending downwardly from a lower surface of said cover strip so as to be disposed within said longitudinally extending trough-like grooves of said base strip when said cover strip is secured to said base strip and for engaging and pressing against top surfaces of said components disposed within said cavities of said base strip so as to restrict any extraneous movement of said components and thus prevent said components from prematurely falling out of said cavities during wrapping of said carrier tape system around a storage reel;
wherein a portion of said cover strip defined within the vicinity of said retaining means includes a clear viewing window for viewing said components disposed within said cavities of said base strip.

15. A system as set forth in claim 14, wherein:
said retaining means comprises a pair of laterally spaced rail members coextensive with said cover strip and extending longitudinally parallel to said sidewalls.

16. A carrier tape system as claimed in claim 15, wherein said rail members of said retaining means are flared outwardly at a slight angle towards said respective opposed sidewalls.

17. A carrier tape system as claimed in claim 14, wherein said cover strip includes a hump projecting upwardly from said top surface and extending longitudinally in a parallel relationship to said sidewalls.

18. A carrier tape system as claimed in claim 17, wherein said base strip further includes a plurality of longitudinally spaced sprocket holes extending therein adjacent said cavities.

19. A carrier tape system as claimed in claim 18, wherein said sprocket holes are aligned with said hump of said cover strip.

20. A carrier tape system as claimed in claim 19, wherein each of said sidewalls has an inwardly extending hooked portion formed integrally therewith, said hooked portion having its top surface spaced beneath the edge of said base strip to form a U-shaped recess to secure said cover strip to said base strip.

21. A carrier tape system as claimed in claim 14, wherein said plurality of component cavities are of a rectangularly-shaped configuration and include a plurality of ridge segments disposed therein for retaining bodies fine pitch surface devices so that the leads thereof are free from engagement with any portion of the carrier tape system.

22. The system as set forth in claim 12, wherein:
said viewing window is formed of a static dissipative material and the remainder of said cover strip is made of a conductive plastic material.

23. The system as set forth in claim 9, wherein:
said plastic material is selected from the group comprising carbon-loaded polyvinyl chloride, polypropylene, and polyethylene terephthalate.

24. The system as claimed in claim 14, wherein:
each one of said plurality of cavities has said bottom wall portion comprising an elevated peripheral portion and an elevationally depressed central portion whereby when said components are disposed within said cavities, each one of said components will be supported by means of a peripheral portion thereof upon said elevated peripheral portion of said bottom wall portion while a central portion of each one of said components will be free of contact with said bottom wall portion so as to reduce the possibility of physical damage to each one of said components by said bottom wall portion.

* * * * *